United States Patent
Kwon et al.

(10) Patent No.: US 6,768,269 B2
(45) Date of Patent: Jul. 27, 2004

(54) PLASMA PROCESS CHAMBER MONITORING METHOD AND SYSTEM USED THEREFOR

(75) Inventors: Gi-Chung Kwon, Gyeonggi-do (KR); Hong-Sik Byun, Gyeonggi-do (KR); Young-Suk Lee, Gyeonggi-do (KR)

(73) Assignee: Jusung Engineering Co., Ltd. (KR)

( * ) Notice: Subject to any disclaimer, the term of this patent is extended or adjusted under 35 U.S.C. 154(b) by 0 days.

(21) Appl. No.: 10/288,129

(22) Filed: Nov. 4, 2002

(65) Prior Publication Data

US 2003/0085662 A1 May 8, 2003

(30) Foreign Application Priority Data

Nov. 5, 2001 (KR) .......................................... 2001-68510

(51) Int. Cl.[7] ........................... H01J 7/24; H01L 21/306
(52) U.S. Cl. ................. 315/111.21; 315/129; 315/291; 156/345.24; 156/345.28
(58) Field of Search ............................ 315/111.21, 119, 315/129, 120, 291, 307; 118/712, 723 R; 156/345.24, 345.28

(56) References Cited

U.S. PATENT DOCUMENTS

| | | | | |
|---|---|---|---|---|
| 5,665,166 A | * | 9/1997 | Deguchi et al. | ......... 118/723 E |
| 5,976,334 A | * | 11/1999 | Fu et al. | ................. 204/298.19 |
| 2001/0025691 A1 | * | 10/2001 | Kanno et al. | ................ 156/345 |
| 2001/0051437 A1 | * | 12/2001 | Cruse | .......................... 438/706 |
| 2002/0040765 A1 | * | 4/2002 | Suzuki | .................. 156/345.28 |
| 2002/0114123 A1 | * | 8/2002 | Nishio et al. | ................ 361/234 |

* cited by examiner

Primary Examiner—James Clinger
Assistant Examiner—Thuy Vinh Tran
(74) Attorney, Agent, or Firm—Duane Morris LLP

(57) ABSTRACT

A plasma process chamber is monitored for excess current while fabricating a semiconductor device. The method includes grounding the plasma process chamber in which fabricating a semiconductor device is conducted using a plasma; detecting a current flowing in a ground line from the plasma process chamber to the ground; interpreting whether the detected current is more than a reference value during fabricating the semiconductor device; and deciding that the plasma process chamber is in an abnormal state when the detected current is more than the reference value. It is thereby possible to produce more stable plasma and the operation of the plasma process chamber is stabilized. Further, the expected life span of the plasma process chamber and other devices is enlarged, and the risk of injuring the operator is prevented.

6 Claims, 2 Drawing Sheets

PLASMA PROCESS CHAMBER MONITORING METHOD AND SYSTEM USED THEREFOR

This application claims the benefit of Korean Patent Application No. 2001-0068510 filed on Nov. 5, 2001, in Korea, which are both hereby incorporated by reference.

BACKGROUND OF THE INVENTION

1. Field of the Invention

The present invention relates to a method and system of monitoring a plasma process chamber, and more particularly, to a method and system that prevent an arcing in the plasma process chamber during a plasma process.

2. Description of Related Art

In a plasma process used for fabricating semiconductor devices, a high frequency power is applied to a process chamber to generate the plasma. At this time of applying the high frequency power, if the process chamber is electrically floated (not grounded), the process chamber will be charged up by the applied high frequency power. The charged ion species in the process chamber threaten the operator and cause the unstable operation of the process chamber. Thus, the process chamber is generally grounded. Especially, the ground line connected to the process chamber has low impedance.

If the charged ion species in the process chamber do not leak properly, micro-arcing occurs between the generated plasma and the charged ion species. Furthermore, the charged ion species will cause the micro-arcing in the bad connection part of the ground line. In case of producing the micro-arcing, the plasma generated in the process chamber do not have stability; the plasma process conducted in the process chamber is not trusted; the expected life span of the process chamber and other devices will be shortened; and the operator conducting the plasma process devices may be harmed.

Therefore, a new method and system have been required to prevent the occurrence and frequency of the arching caused by the charged ion species in the plasma process chamber.

SUMMARY OF THE INVENTION

Accordingly, the present invention is directed to plasma process chamber monitoring method and system that substantially overcome one or more of the problems due to limitations and disadvantages of the related art.

An advantage of the present invention is to provide a method and system of monitoring a plasma process chamber in order to prevent arcing caused by charged ion species.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of monitoring a plasma process chamber in which fabricating a semiconductor device is conducted using a plasma includes grounding the plasma process chamber using a ground line; detecting a current flowing in the ground line from the plasma process chamber to the ground; interpreting whether said current is more than a reference value during fabricating the semiconductor device; and deciding that the plasma process chamber is in an abnormal state when said current is more than the reference value.

In order to accomplish the above advantages, in another aspect, the principles of the present invention provide a system of monitoring a plasma process chamber. The system includes a plasma process chamber which is grounded by a ground line and in which a semiconductor device fabrication is conducted; a current detecting sensor detecting a current flowing in the ground line from the plasma process chamber to the ground; a programmable logic controller (PLC) connected to the current detecting sensor, wherein the PLC provides an abnormal signal output when the current detected by the current detecting sensor is more than a reference value and a normal signal output when the current detected by the current detecting sensor is less than the reference value; and a central controlling computer connected to the PLC, wherein the central controlling computer interprets the abnormal signal as the plasma process chamber is in an abnormal state, outputs an alert signal through a warning system, and shuts off a high frequency power that is applied to the plasma process chamber to generate the plasma when the central controlling computer receives the abnormal signal from the PLC. In the present invention, the current detecting sensor is a current transformer (CT) or a current detector. The reference value is 1 ampere (A).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment of the invention and together with the description serve to explain the principle of the invention.

In the drawings.

DETAILED DESCRIPTION OF ILLUSTRATED EMBODIMENTS

Reference will now be made in detail to illustrated embodiment of the present invention, examples of which are shown in the accompanying drawings. Wherever possible, the same reference numbers will be used throughout the drawings to refer to the same or similar parts.

Figure 1:
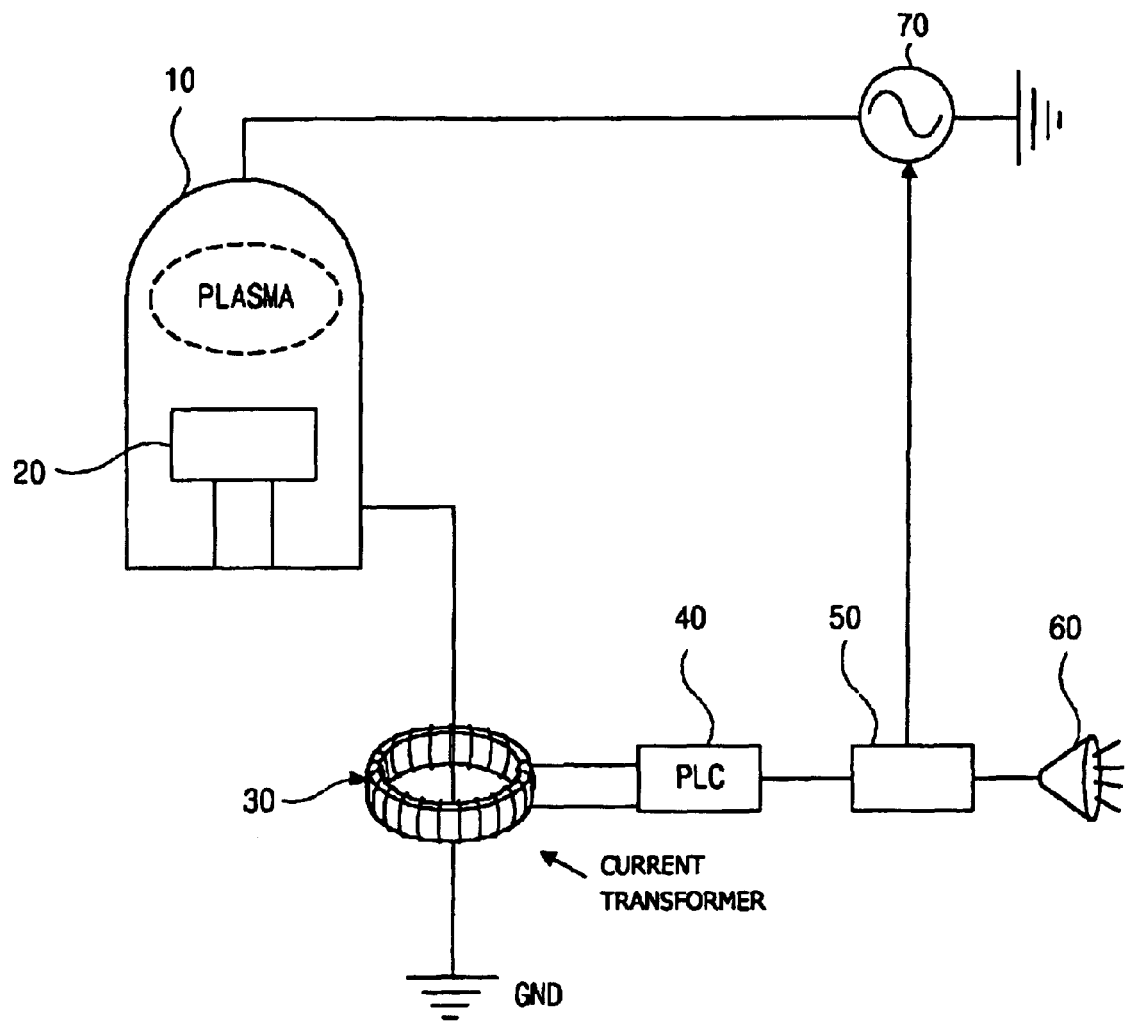
FIGS. 1 and 2 schematically illustrate a method and system of monitoring a plasma process chamber according to the present invention.

FIG. 1 schematically illustrates a method and system of monitoring a plasma process chamber according to the present invention.

Referring to FIG. 1, a plasma process chamber 10 conducts a semiconductor device fabrication therein. The plasma process chamber 10 is used for High Density Plasma Chemical Vapor Deposition (HDP-CVD), Plasma Enhanced Chemical Vapor Deposition (PECVD), dry etch, etc. During the plasma process, a wafer is mounted on a wafer pedestal 20 that is positioned inside the plasma process chamber 10. In order to generate the plasma, high frequency power 70 is then applied to an electrode (not shown) that is installed in the plasma process chamber 10. At this time, if the plasma process chamber is electrically in a floating state (not grounded), the electric charges are accumulated in the plasma process chamber 10 by the applied high frequency power 70 and then the charged ions will damage the devices and hurt the operators. Thus, the plasma process chamber is grounded through a ground line as shown in FIG. 1.

In the present invention, a current detecting sensor 30 is installed in the ground line so as to detect a flow of current that flows from the plasma process chamber 10 to the ground (GND). The current detecting sensor 30 can be a current transformer (CT), a current detector, or other current detecting device. The current detecting sensor 30 can catch direct current (DC). Additionally, the current detecting sensor 30 can catch alternating current and radio frequency to read the RMS (root mean square) current value.

Still referring to FIG. 1, a Programmable Logic Controller (PLC) 40 is connected to the current detecting sensor 30. The PLC 40 provides an abnormal signal output when the current detected by the current detecting sensor 30 is more than a reference value (e.g., 1 A). And the PLC 40 provides a normal signal output when the current detected by the current detecting sensor 30 is less than the reference value (e.g., 1 A).

A central controlling computer 50 is connected to the PLC 40, and then a warning system 60 is connected to the central controlling computer 50. When the central controlling computer 50 receives the abnormal signal from the PLC 40, the central controlling computer 50 interprets the abnormal signal as the plasma process chamber 10 is in an abnormal state. Thus, the central controlling computer 50 outputs an alert signal through the warning system α or shuts off the high frequency power 70 that is applied to the chamber to generate the plasma. In the present invention, the central controlling computer 50 is connected to not only the plasma process chamber 10 but also the other power consumption or supply devices.

Figure 2:
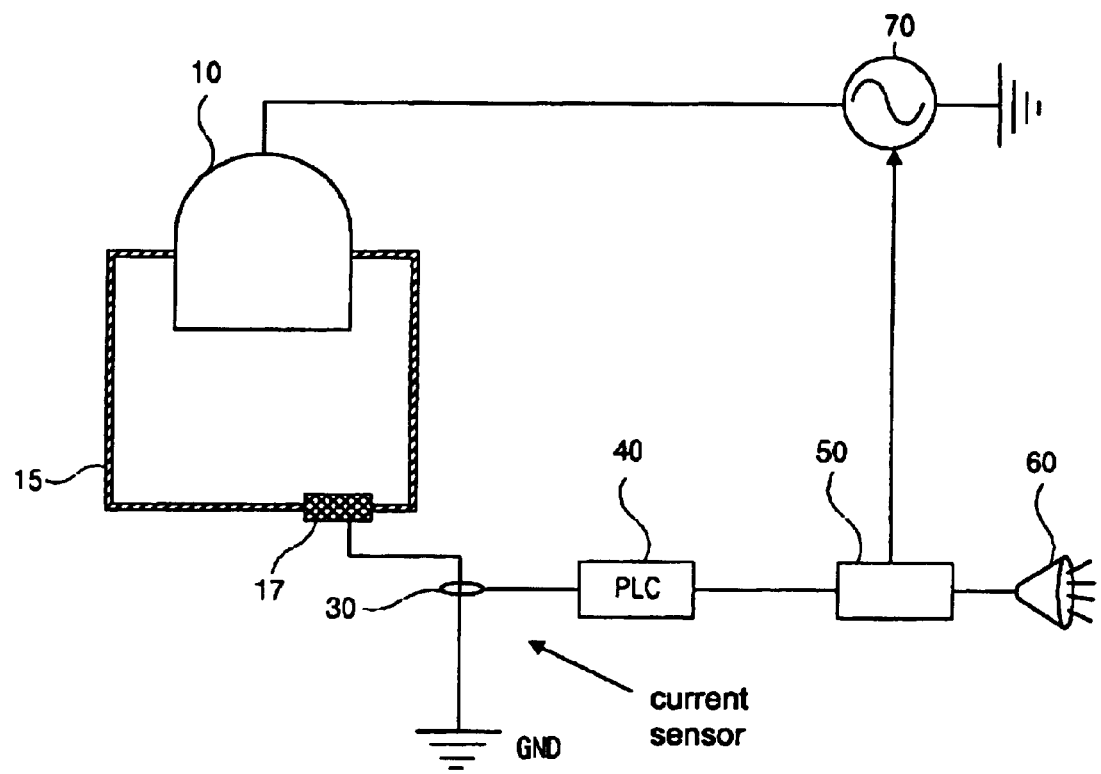

FIG. 2 schematically illustrates a method and system of monitoring a plasma process chamber according to another example of the present invention. As shown, the plasma process chamber 10 is often supported by a chamber frame 15 that includes a ground (GND) bar 17 at one side. At this point, the chamber frame 15 is grounded through the ground line connected to the GND bar 17. Likewise, the current detecting sensor 30 is installed in the ground line to detect whether the plasma process chamber 10 is charged overly or not. Since the plasma process chamber 10 is supported by and connected to the chamber frame 15, the electric charges accumulated in the plasma process chamber 10 flow out to the ground (GND) and detected by the current detecting sensor 30.

As described hereinbefore, the plasma process chamber is grounded and the current detecting sensor monitors the current flowing in the ground line. The programmable logic controller and the central controlling computer control and decide the supply of the high frequency power and other power consumption and supply device. Therefore in the present invention, the over-charge of the plasma process chamber is then prevented, and then it is possible to produce more stable plasma. Further, the operation of the plasma process chamber is stabilized; the expected life span of the plasma process chamber and other devices is enlarged; and the risk of injuring the operator is prevented.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of monitoring a plasma process chamber in which fabricating a semiconductor device is conducted using a plasma, comprising:

grounding the plasma process chamber using a ground line;

detecting a current flowing in the ground line from the plasma process chamber to the ground;

interpreting whether said detected current is greater than a reference current value during fabricating the semiconductor device; and deciding that the plasma process chamber is in an abnormal state when said detected current is greater than the reference current value, outputting an alert signal through a warning system when said detected current is greater than the reference current value;

shutting off a high frequency power that is applied to the plasma process chamber to generate a plasma at the time when the alert signal is received.

2. The method of claim 1, wherein the reference current value is 1 ampere (A).

3. A system of monitoring a plasma process chamber, comprising:

a plasma process chamber which is grounded by a ground line and in which a semiconductor device fabrication is conducted;

a current detecting sensor for detecting a current flowing in the ground line from the plasma process chamber to the ground;

a programmable logic controller (PLC) connected to the current detecting sensor, wherein the PLC provides an abnormal signal output when the current detected by the current detecting sensor is greater than a reference current value and a normal signal output when the current detected by the current detecting sensor is less than the reference current value; and a central controlling computer connected to the PLC, wherein the central controlling computer interprets the abnormal signal as the plasma process chamber is in an abnormal state, outputs an alert signal through a warning system, and shuts off a high frequency power that is applied to the plasma process chamber to generate the plasma when the central controlling computer receives the abnormal signal from the PLC.

4. The system of claim 3, wherein the current detecting sensor is a current transformer.

5. The system of claim 3, wherein the current detecting sensor is a current detector.

6. The system of claim 3, wherein the reference current value is 1 ampere (A).

* * * * *